United States Patent
Sakamoto et al.

(10) Patent No.: US 6,342,321 B1
(45) Date of Patent: Jan. 29, 2002

(54) METHOD OF DRYING RESINOUS COMPOSITION LAYER, METHOD OF MANUFACTURING COLOR FILTER SUBSTRATE USING THE SAME DRYING METHOD, AND LIQUID CRYSTAL DISPLAY DEVICE

(75) Inventors: Junichi Sakamoto, Yokohama; Nagato Osano, Kawasaki; Tadanori Suto; Kenichi Iwata, both of Tokyo, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/467,981

(22) Filed: Dec. 21, 1999

(30) Foreign Application Priority Data

Dec. 25, 1998 (JP) ............................................. 10-369266

(51) Int. Cl.[7] .......................... G02B 5/20; G02F 1/1335; B05D 3/12
(52) U.S. Cl. ........................... 430/7; 430/327; 349/106; 427/350
(58) Field of Search ..................... 430/7, 327; 427/350; 349/106

(56) References Cited

U.S. PATENT DOCUMENTS

| | | | |
|---|---|---|---|
| 3,529,960 A | 9/1970 | Sloan | 96/36 |
| 3,935,331 A | 1/1976 | Poliniak et al. | 427/43 |
| 5,721,076 A | 2/1998 | Watanabe et al. | 430/7 |
| 5,817,441 A | 10/1998 | Iwata et al. | 430/7 |
| 5,888,679 A | 3/1999 | Suzuki et al. | 430/7 |

FOREIGN PATENT DOCUMENTS

| | | |
|---|---|---|
| DE | 39 35 476 | 5/1991 |
| EP | 0 503 475 | 9/1992 |
| JP | 6-97061 | 4/1994 |
| JP | 9-133807 | 5/1997 |

*Primary Examiner*—John A. McPherson
(74) *Attorney, Agent, or Firm*—Fitzpatrick, Cella, Harper & Scinto

(57) ABSTRACT

A method of drying a resinous composition layer, comprises the steps of coating a resinous composition over a substrate and drying the resinous composition layer to be dried. The drying method is a vacuum dry. And a drying condition in that case is such that an exhaustion is performed taking over 6 sec. till a degree of vacuum comes to 100 Torr.

5 Claims, 4 Drawing Sheets

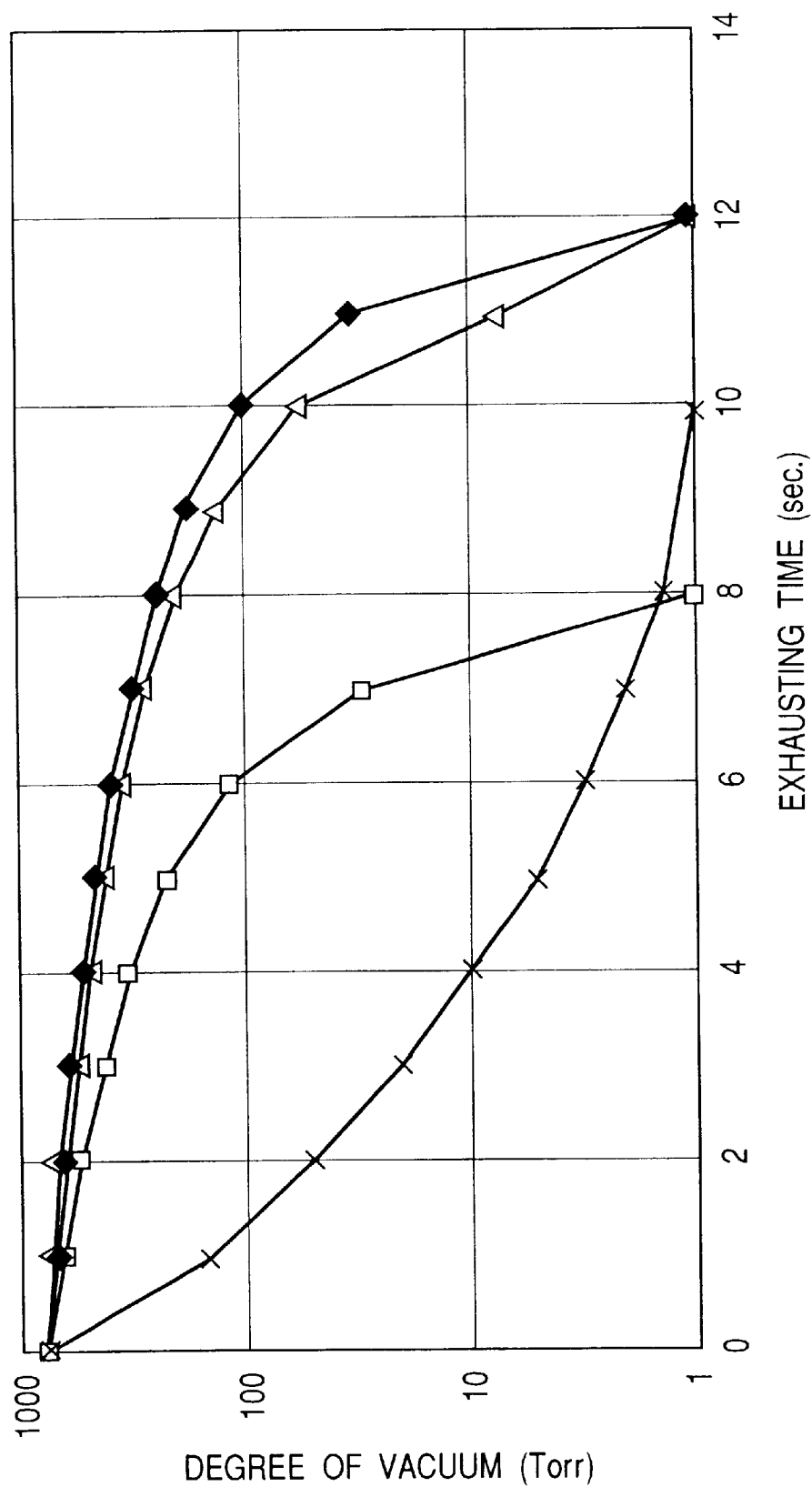

METHOD OF DRYING RESINOUS COMPOSITION LAYER, METHOD OF MANUFACTURING COLOR FILTER SUBSTRATE USING THE SAME DRYING METHOD, AND LIQUID CRYSTAL DISPLAY DEVICE

BACKGROUND OF THE INVENTION

1. Field of the Invention

The present invention relates to a method of drying a resinous composition layer using vacuum drying, a method of manufacturing color filter substrate using this drying method, and a liquid crystal display device.

2. Related Background Art

In a color filter for a liquid crystal display and for a video camera, it is now indispensable for obtaining a higher contrast and a higher resolution to form a black matrix. A method of forming the black matrix may be roughly classified into a method using a metal film of chrome etc. and a method of using a black resin.

In the case of using the metal film, a typical method is that in advance of forming pixels in respective colors such as red (R), green (G) and blue (B), a metal film of chrome etc. is provided on a transparent substrate by sputtering, and thereafter the black matrix is formed via a photolithography process and an etching process. This method, however, requires vacuum layer forming equipment and has a large number processes, which leads to a rise in manufacturing costs. Further, if eventually applied to a display device, a defect is that the screen is hard to be watched because of a reflection peculiar to the metal film.

What is most typical among the methods involving the use of the black resin, is a method of previously forming the black matrix composed of the black photosensitive resin by the photolithography, and sequentially forming the respective pixels in red, green and blue inside the black matrix by the photolithography.

Further, Japanese Patent Application Laid-Open No. 9-133807 discloses a method of forming a light-shielding layer (black matrix) extending between the red, green and blue pixels by coating, over the entire surface of a transparent substrate formed beforehand with the red, green and blue pixels, a black resist containing a cationic polymerizing compound, a black pigment, a light acid producing agent and a solvent so that all gaps between the red, green and blue pixels are filled with the black resist, then drying the coated substrate, subsequently a non-coated surface (the surface of the transparent substrate) of the substrate is exposed to beams of ultraviolet light, executing thermal hardening and development after the exposure, and thereby forming the light shielding layer (black matrix) extending between the red, green and blue pixels.

According to this method, however, after finishing the coating of the black resist, and the coated substrate is heated (pre-baked) at 50° C. to 100° C. for 1 min. to 10 min. by use of a hot plate and an oven, thereby removing the residual solvent and drying the substrate. Therefore, the resist starts reacting, resulting in such a problem that a developing characteristic might decline in several hours.

On the other hand, Japanese Patent Application Laid-Open No. 6-97061 discloses a method of forming an interference preventive coated film containing a water content by coating a water-soluble reflection preventive film material over a resist film formed through a coating process and a heat-drying (pre-baking) process, and forming a reflection preventive film by drying the interference preventive coated film in vacuum. According to this method, the solvent is water, and hence the drying process requires a vacuum state as high as 0.01 Torr and a processing time as long as 120 sec. under this high vacuum state. Further, a pump system becomes expensive in order to obtain the vacuum degree of 0.01 Torr.

The present inventors have examined a possibility of an application of the above-described vacuum-drying method when drying the resist, and it has proven that there arise problems peculiar to the pigment dispersed resist such as occurrences of defects in which a foreign matter exists on the surface, a pinhole is formed, and the material is coagulated in the case of drying the resist, wherein the vacuum degree is set to 1 Torr under normal operating conditions by use of a prior art vacuum drying device.

SUMMARY OF THE INVENTION

The present invention has been made to solve the above-mentioned problems, and therefore has an object to provide a resinous composition layer drying method capable of forming a resinous layer exhibiting less deterioration of a developing characteristic with an elapse of time without causing defects such as a foreign matter on the surface, a pinhole, and a coagulation of the material.

To accomplish this object, according to the present invention, there is provided a method of drying a resinous composition layer, comprising the steps of: coating a resinous composition over a substrate; and drying the resinous composition layer to be dried, characterized in that the drying method is a vacuum dry, and a drying condition in that case is such that an exhaustion is performed taking over 6 sec. till a degree of vacuum comes to 100 Torr.

BRIEF DESCRIPTION OF THE DRAWINGS

FIG. 5 is a graph showing a relationship between a degree of vacuum and an exhausting time in an embodiment of the present invention and a comparative example thereof.

DESCRIPTION OF THE PREFERRED EMBODIMENTS

A method of drying a resinous composition layer according to the present invention is classified as a vacuum drying method of drying the resinous composition layer in a vacuum atmosphere.

Figure 1:
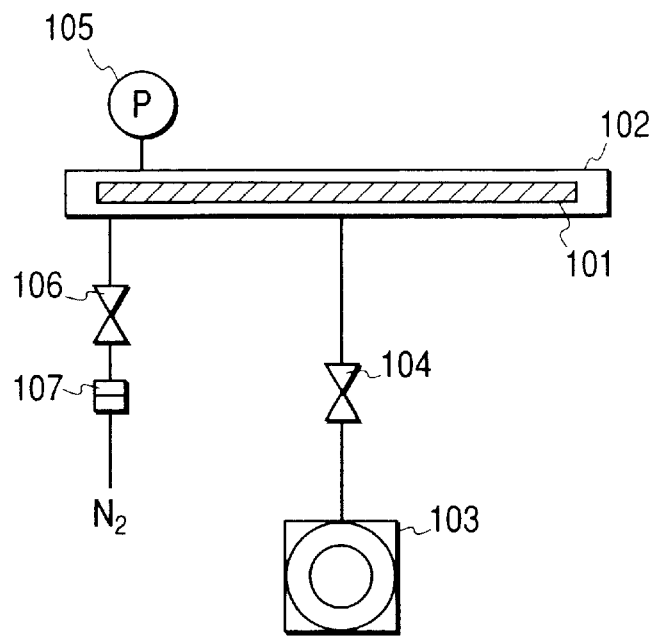
FIG. 1 is a schematic diagram showing one example of a vacuum device for carrying out a drying method of the present invention.

As illustrated in FIG. 1, a resinous composition layer 101 formed on a substrate is placed in a chamber 102, and dried by a vacuum pump 103 evacuating the chamber 102. In that case, a valve 104 provided between the pump 103 and the chamber 102 controls an exhaustion of the pump 103. Based on the drying method of the present invention, the exhaustion is carried out taking a time of over 6 sec. up to a vacuum degree of 100 Torr, and thereafter speeded up.

This process prevents a pinhole from being formed in the surface of the resinous composition layer and a material from being coagulated. Further, if the resinous composition is a photosensitive resinous composition, the photosensitive resinous composition, though a stay time from the vacuum drying to an exposure is long, can be well subjected to patterning.

For example, the photosensitive resinous composition layer, which has been pre-baked for 180 sec. at 80° C., becomes unable to undergo the patterning in 4 hours. According to the drying method of the present invention, the composition layer can be subjected to the patterning even after a 240-hour elapse.

Moreover, according to the present invention, a patterning characteristic is enhanced, while residues decrease. Namely, a solubility of the resinous layer is high because of giving no heat, and the patterning characteristic is enhanced. Further, there decrease resin residues on pixels after being developed for the same reason.

According to the drying method of the present invention, it is preferable that the exhaustion be performed taking the time of over 6 sec. up to the vacuum degree of 100 Torr, and subsequently speeded up down to a vacuum degree of 1 Torr or under, and the coated substrate be further dried for 15 to 50 sec. under this condition of the vacuum degree being 1 Torr or less.

The valve 104 may preferably involve the use of a flow rate variable type valve such as a butterfly and a needle valve etc. As for the flow rate variable type valve, a valve aperture thereof may be controlled by a timer or by a feedback of a signal of a pressure gauge.

Figure 2:
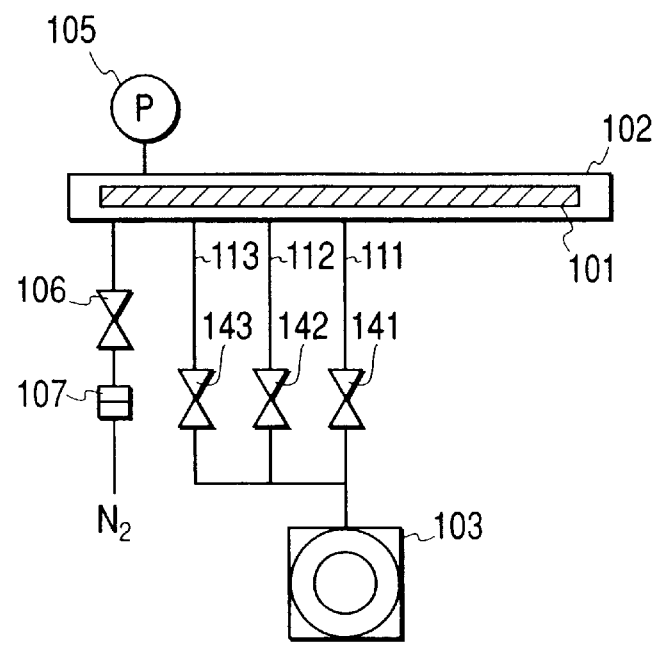
FIG. 2 is a schematic diagram showing another example of the vacuum device for carrying out the drying method of the present invention.
Figure 3A:
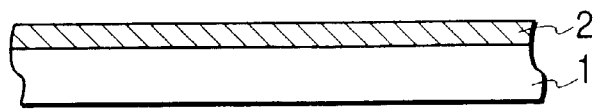
FIGS. 3A, 3B, 3C, 3D and 3E are diagrams showing one example of processes of a method of manufacturing a color filter substrate according to the present invention.
Figure 3B:
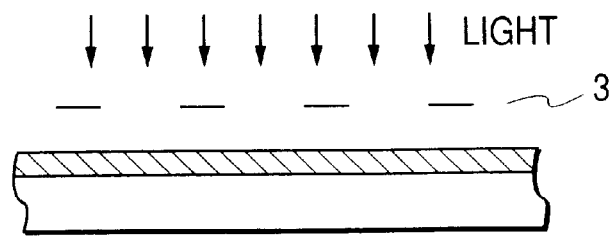
Figure 3C:
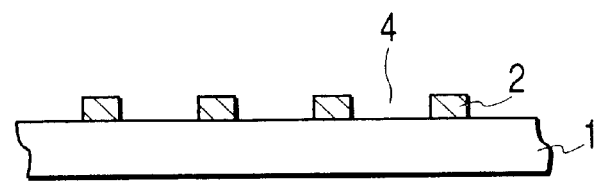
Figure 3D:
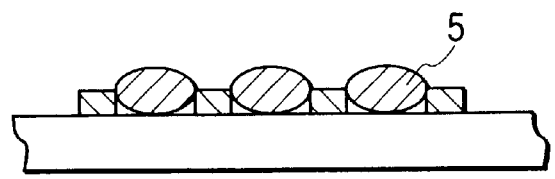
Figure 3E:
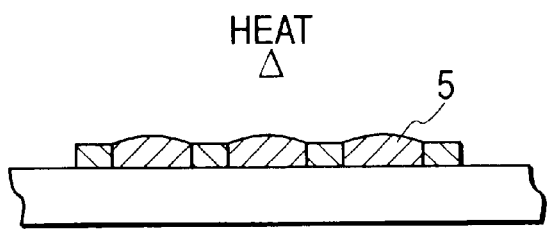

A vacuum device shown in FIG. 2 controls an exhaust quantity not by use of the flow rate variable type valve but by use of a plurality of valves 141, 142, 143. To be specific, the pump 103 is connected via a plurality of pipes to the chamber 102, and the respective pipes are provided with the valves 141, 142, 143. The valves 141, 142, 143 are sequentially opened by the timer, thus controlling the exhaust quantity.

Referring to FIGS. 1 and 2, there are shown a pressure gauge 105, a leak valve 106 and a filter 107.

The resinous layer drying method of the present invention is applied preferably to a process of manufacturing a color filter. Normally, the color filter is constructed of a transparent substrate on which to form a light shielding layer known as a black matrix or a black stripe, a coloring layer having coloring pixels of three primary colors such as R (red), G (green) and B (blue) with the light shielding layer openings being used for the coloring pixels, and a protection layer provided as the necessity may arise. Accordingly, the drying method of the present invention is applied to a process of coating a resist used for the patterning of the light shielding layer, whereby a preferable color filter can be structured.

The color filter can be manufactured by, for instance, a series of processes as shown in FIGS. 3A to 3E. Note that FIGS. 3A to 3E correspond to processes (a) to (e) which follow.

(a) A photosensitive resinous composition 2 in black is coated over the transparent substrate 1, and dried by the drying method of the present invention. The coated film is thick enough to obtain a light shielding property required, and this thickness is on the order of, e.g., 1 μm. Note that the transparent substrate involves the use of, e.g., glass in many cases, however, a plastic film and a plastic sheet may also be available. Further, as the case may be, a thin film for enhancing an adhesion may be previously formed on the transparent substrate in order to increase the adhesion between the transparent substrate, the black matrix and coloring inks.

(b) The dried layer is exposed to the light by use of an exposure apparatus having a wavelength matching with a sensitivity of the photosensitive resinous composition, and a mask 3 having a predetermined pattern.

(c) A developing process is executed, and, if being a negative type, the layer shielded from light by the mask 3 when in the exposure process is eluted by a liquid developer, with the result that the substrate surface is exposed and the exposed area is left as a black matrix pattern.

(d) An ink 5 in a predetermined color is so applied as to fill in black matrix gap areas 4. A method of applying the ink may involve the use of typical printing methods such as offset printing, gravure and screen printing etc. Particularly, an ink jet printing method using an ink jet printing machine, however, does not employ a plate when in the printing process, and is therefore preferable in terms of being capable of performing high-accuracy patterning if attempting to control a diameter of an ink droplet. The inks, which tend to be repelled on the black matrix pattern but permeate the pixel areas in the black matrix gaps, are properly selected and used herein. A surface energy (surface tension) is normally on the order of 30 to 70 dyne/cm. The inks described above may come under either dye series or pigment series, and a solvent is composed mainly of water and may contain an organic solvent exhibiting hydrophilic property.

(e) The black matrix is formed by effecting a heat drying treatment (post-baking) so as to cure the black cure the black matrix. At this time, it is preferable to conduct a curing for the ink simultaneously. Thereafter, the protective film is coated and dried by the drying method of the present invention, according to the necessity.

Figure 4:
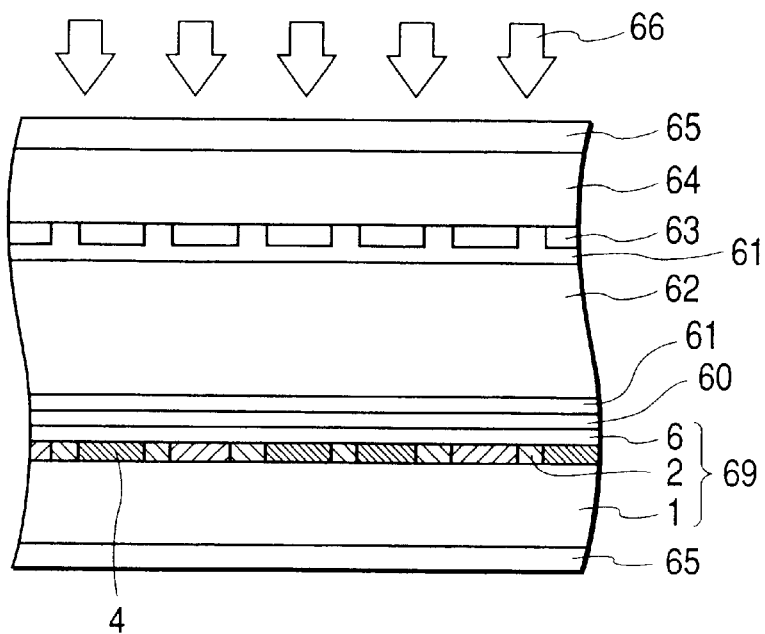
FIG. 4 is a sectional view showing one example of a liquid crystal display device according to the present invention.

FIG. 4 shows a section of a TFT color liquid crystal panel incorporating the color filter according to the present invention. It is to be noted that a form thereof is not limited to what is exemplified in this embodiment.

The color liquid crystal panel is typically constructed by matching the color filer substrate 1 with an opposing substrate 64 and sealing a liquid crystal composition 62 therebetween. TFTs (not shown) and transparent pixel electrodes 63 are formed in matrix inwardly of one substrate 64 of the liquid crystal panel. Further, a color filter 69 is provided inwardly of the other substrate 1 so that RGB color materials are arranged in positions facing to the pixel electrodes. A transparent opposing electrode (common electrode) 60 is provided on the color filter 69. The black matrix is normally formed on the side of the color filter substrate. Moreover, an orientation film 61 is formed within the plane between the two substrates and subjected to a rubbing process, whereby liquid crystal molecules can be arrayed in a fixed direction. Further, a polarizing plate 65 is bonded to an external portion of each glass substrate, and a liquid crystal compound 62 fills in a gap (on the order of 2 to 5 μm) between those glass substrates. Generally, a combination of a fluorescent lamp (not shown) and a scattering plate (not shown) is used as a back light, and the liquid crystal compound functions as an optical shutter for varying a transmissivity of a beam of the back light, thus performing the display.

Embodiments of the present invention and comparative examples thereof will hereinafter be described.

(Embodiment 1)

A V-259-BK-739P black resist material manufactured by Nippon Steel Chemical Co., Ltd. is coated over a no-alkali glass substrate by use of a spin coater. The number of revolutions thereof at that time is 600 rpm, which is held for 30 sec. Thereafter, the coated substrate is disposed within the vacuum drying device shown in FIG. 1, and the exhaustion is effected by the butterfly valve for 10 sec., wherein an exhaust speed is set to a fixed value of 66 Torr/sec. Thereafter, the valve is fully opened, and the exhaustion is performed down to 1 Torr. Then, after bending the vacuum chamber, the substrate is taken out, and the surface is observed. As a result, a surface state is preferable enough to show no particular defects such as a foreign matter, a pinhole and a coagulation of the material.

FIG. 5 shows a time elapse of the vacuum degree within the vacuum drying device. Marks ♦, Δ indicate those in the embodiment 1 and define a range of scattering when a plurality of coated substrates are dried in vacuum. Note that a mark □ indicates an exhausting time versus vacuum degree curve in an embodiment 3, while a mark x indicates an exhausting time versus vacuum degree curve in a comparative example 2 which will be described later on, respectively.

The substrate undergoes the exposure, development and post-baking under the conditions shown in Table 1, thereby obtaining a resin black matrix pattern. This resin black matrix pattern has no residue of the resist on the pixel area, and the black matrix area and the pixel area are separated sharply at the boundary thereof, whereby the preferable black matrix can be obtained.

TABLE 1

| | |
|---|---|
| Exposure | Canon PLA-600FA, Gap; 5 μm, Exposure Time; 4 sec. (48 mJ) |
| Development | Spin Development, Developing Pressure; 0.2 MPa, Number of Revolutions; 200 rpm, Processing Time; 15 sec., Rinse; 10 MPa, 200 rpm, 20 sec. |
| Post-Baking | Atmospheric Oven; 200° C., 60 min |

(Embodiment 2)

The substrate dried in vacuum under the conditions given above has been held under an environment of a clean room for one week, and is thereafter subjected to the exposure, development and post-baking under the same conditions, thereby obtaining a resin black matrix pattern.

This resin black matrix pattern, as in the case of what has undergone the exposure, development and post-baking immediately after the vacuum drying process in the embodiment 1 has been finished, has no residue on the pixel area, and the black matrix area and the pixel area are separated sharply at the boundary thereof, whereby the preferable black matrix can be gained.

(Embodiment 3)

A CK-S171X black resist material made by Fujifilm Olin Co., Ltd. is coated over a no-alkali glass substrate by use of the spin coater. The number of revolutions thereof at that time is 600 rpm, which is held for 30 sec. Thereafter, the coated substrate is disposed within the vacuum drying device shown in FIG. 1, and the exhaustion is effected by the butterfly valve for 6 sec., wherein an exhaust speed is set to a fixed value of 100 Torr/sec. Thereafter, the butterfly valve is opened, and the exhaustion is performed down to 1 Torr. Then, after bending the vacuum chamber, the substrate is taken out, and the surface is observed. As a result, a surface state is preferable enough to show no particular defects such as a foreign matter, a pinhole and a coagulation of the material.

The substrate dried in vacuum under the conditions given above has been held under the environment of the clean room for 10 days, and is thereafter subjected to the exposure, development and post-baking under the conditions shown in Table 1, thereby obtaining a resin black matrix pattern.

This resin black matrix pattern, as in the case of what has undergone the exposure, development and post-baking immediately after the vacuum drying process has been finished, has no residue on the pixel area, and the black matrix area and the pixel area are separated sharply at the boundary thereof, whereby the preferable black matrix can be obtained.

Comparative Example 1

The V-259-BK-739P black resist material manufactured by Nippon Steel Chemical Co., Ltd. is coated over a no-alkali glass substrate by use of the spin coater. The number of revolutions thereof at that time is 600 rpm, which is held for 30 sec. Thereafter, the post-baking is carried out by use of a hot plate. A condition at that time is such that the substrate is held at 80° C. for 180 sec.

As a result of observing the surface of the substrate, the surface state is preferable enough to show no particular defects such as a foreign matter, a pinhole and a coagulation of the material.

This substrate has been held under the environment of the clean room for four hours, and is thereafter subjected to the exposure, development and post-backing under the conditions shown in Table 1, thereby obtaining a resin black matrix pattern.

This resin black matrix pattern has an extremely large quantity of residues on the pixel areas, and the boundary between the black matrix area and the pixel area is distorted with ruggedness, with the result that a preferable black matrix could not be obtained.

Comparative Example 2

A BK-739P black resist material made by Nippon Steel Chemical Co., Ltd. is coated over a no-alkali glass substrate by use of the spin coater. The number of revolutions thereof at that time is 600 rpm, which is held for 30 sec. Thereafter, the coated substrate is disposed within the vacuum drying device, and the exhaustion is effected down to 1 Torr for 10 sec. by opening the butterfly valve. Then, after bending the vacuum chamber, the substrate is taken out, and the surface is observed. As a result, there occur defects such as particularly a foreign matter, a pinhole and a coagulation of the material.

The substrate undergoes the exposure, the development and the post-baking under the conditions given in Table 1, thereby obtaining a resin black matrix pattern.

This resin black matrix pattern has a small quantity of residues on the pixel areas, however, the boundary between the black matrix area and the pixel area is distorted with the ruggedness, and the black matrix is partially linearly disconnected.

(Embodiment 4)

As shown in FIG. 4, an OPTMER SS6699G protection layer material manufactured by JSR Corp. Is coated by the spin coater over the color filter substrate formed of a resin BM by an ink jet method. The number of revolutions of the substrate at that time is 1,000 rpm, which is held for 30 sec. Thereafter, the coated substrate is disposed within the vacuum drying device, and a valve 142 is opened for 10 sec. A degree of vacuum at that time is 100 Torr. Thereafter, the valves 142 and 143 are simultaneously opened for 8 sec. A degree of vacuum at that time is 10 Torr. Thereafter, the main valve 141 is opened for 5 sec., and the exhaustion is effected down to 1 Torr. Then, after bending the vacuum chamber, the substrate is taken out, and the surface is observed. As a result, the surface state is preferable enough to show no defects such as a foreign matter, a pinhole and a bubbles.

This substrate is held at 230° C. for 60 min. in a clean oven after being dried in vacuum, and the baking is completed, thereby obtaining a color filter substrate. Diameters of pipes 141, 142, 143 are respectively 70 mm, ¼ inch and ¼ inch.

Comparative Example 3

Figure 6:
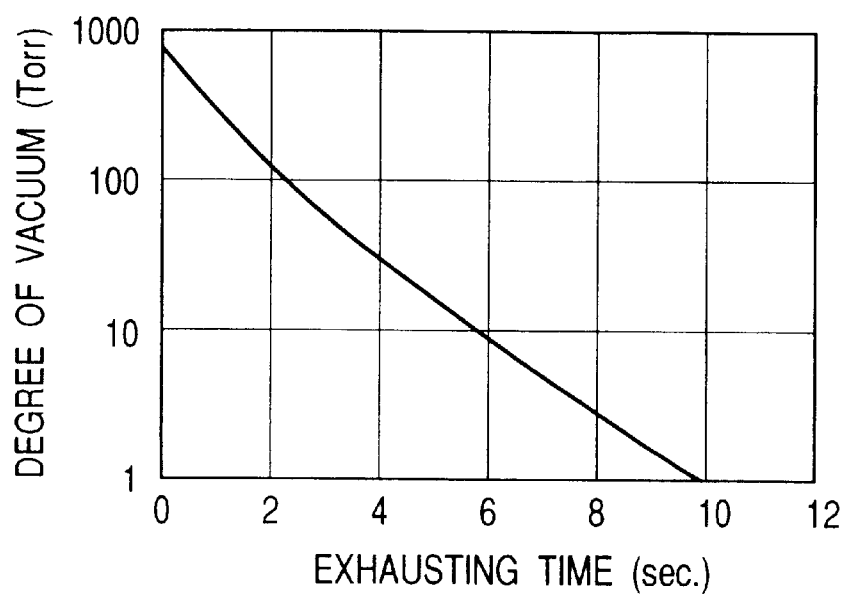
FIG. 6 is a graph showing a relationship between the degree of vacuum and the exhausting time in a comparative example 3.

A substrate equivalent to the substrate in the embodiment 4 is disposed within the vacuum drying device, and the valve 141 is opened for 10 sec. A degree of vacuum at that time is 1 Torr. A relationship between the exhausting time and the degree of vacuum is shown in FIG. 6. Thereafter, after bending the vacuum chamber, and the substrate is taken out. As a result of observing the surface thereof, the bubbles are produced from inside the substrate layer as well as on the surface of the substrate layer, and it follows that the substrate becomes defective.

In the above-mentioned, the present invention has been discussed so far by exemplifying the examples applied when manufacturing the resin black matrix. The present invention is not, however, limited to the black resist defined as the photosensitive resin in which the black pigment is dispersed but can be applied to cases such as forming the blue, green and red pixels by means of the photolithography by use of the pigment dispersed photosensitive resin and also forming the resist by using the photosensitive resin with other pigments being dispersed therein.

As explained above, according to the present invention, the pigment dispersed photosensitive resin coated over the substrate is dried by the vacuum drying method, and hence there are yielded effects in which the patterning can be executed even when the process stay time up to the exposure after the coating increases, the patterning characteristic is enhanced, and the etching residues after the development decrease.

Further, the exhaustion is conducted taking 6 sec. up to 100 Torr when in the vacuum drying process, and therefore, irrespective of the pigment dispersed photosensitive resin being dried in vacuum, there occur no defects such as the foreign matter, the pinhole and the coagulation of the material, which are peculiar to the pigment dispersed resist.

What is claimed is:

1. A method of drying a resinous composition layer, comprising the steps of:

coating a resinous composition over a substrate; and drying the resinous composition layer to be dried, wherein said drying method is a vacuum drying method, wherein the vacuum drying method is such that an exhaustion is performed taking over 6 sec. until a degree of vacuum comes to 100 Torr, and wherein after the exhaustion to 100 Torr, there is performed a further prompt exhaustion till the degree of vacuum comes to 1 Torr or less, and said coated substrate is further dried for 15 to 50 sec. under the condition that the degree of vacuum is under 1 Torr.

2. A method of drying of resinous composition layer according to claim 1, wherein said resinous composition is a photosensitive resinous composition.

3. A method of manufacturing a color filter substrate, comprising the steps of:

coating a photosensitive resinous composition over a substrate and drying said coated substrate by said drying method according to claim 1;

forming a pattern on a layer of said photosensitive resinous composition to obtain a black matrix pattern; and applying a coloring ink so as to fill in a black matrix pattern gap.

4. A method of manufacturing a color filter substrate according to claim 3, further comprising a step of, after applying the coloring ink, coating and drying a resinous composition over said photosensitive resinous composition layer to obtain a protection layer.

5. A liquid crystal display device comprising:

a color filter substrate manufactured according to claim 3 or 4;

an opposing substrate disposed facing to said color filter; and a liquid crystal composition sealed between said color filter substrate and said opposing substrate.

* * * * *